United States Patent [19]

Michail et al.

[11] Patent Number: 5,091,659
[45] Date of Patent: Feb. 25, 1992

[54] COMPOSITE LOGIC GATE CIRCUIT WITH MEANS TO REDUCE VOLTAGE REQUIRED BY LOGIC TRANSISTORS FROM EXTERNAL SOURCE

[75] Inventors: Michel S. Michail, Wappingers Falls; James R. Struk, Poughkeepsie, both of N.Y.

[73] Assignee: International Business Machines Corporation, Armonk, N.Y.

[21] Appl. No.: 685,859

[22] Filed: Apr. 16, 1991

[51] Int. Cl.⁵ .............. H03K 19/013; H03K 19/0175
[52] U.S. Cl. .................................... 307/454; 307/455; 307/456; 307/475; 307/270
[58] Field of Search ............................ 307/443, 454-6, 307/475, 270

[56] References Cited

U.S. PATENT DOCUMENTS

| | | | |
|---|---|---|---|
| 3,956,641 | 5/1976 | Berger et al. | 307/215 |
| 4,289,978 | 9/1981 | Konian et al. | 307/270 |
| 4,308,469 | 12/1981 | Cavaliere et al. | 307/455 |
| 4,516,039 | 5/1988 | Matsuzaki et al. | 307/455 |
| 4,531,067 | 7/1985 | Banker et al. | 307/454 |
| 4,605,871 | 8/1986 | Price et al. | 307/455 |
| 4,675,554 | 6/1987 | Koury, Jr. et al. | 307/455 |
| 4,678,942 | 7/1987 | Kanai et al. | 307/455 |
| 4,680,480 | 7/1987 | Hopta | 307/270 |
| 4,749,885 | 6/1988 | Gal | 307/454 |
| 4,779,011 | 10/1988 | Tsunoi et al. | 307/289 |

OTHER PUBLICATIONS

IBM Tech. Disc. Bul., vol. 30, No. 8, 1/88 "XOR–DOTTING and Select–dotting in PCS logic" pp. 70–75.
IBM Tech. Disc. Bul. vol. 29, No. 12 5/87 "Extended Series Gatings with Complementary Emitter–Coupled Logic Circuits" pp. 5634–5635.

*Primary Examiner*—Stanley D. Miller
*Assistant Examiner*—Margaret R. Wambach
*Attorney, Agent, or Firm*—Perman & Green

[57] ABSTRACT

A logic circuit has a plurality of serially connected logic units wherein each unit is a gate comprising a resistor serially connected to a combination of a plurality of transistors connected together in parallel. The transistors of the logic circuit are arranged to enable reduction of the requisite voltage to be provided by an external power source. By reduction of the voltage, the values of resistance can be reduced without exceeding a power dissipation budget. Alternate logic units, in a series of logic units, are constructed of PNP and NPN transistors. Furthermore, the voltage drop across a transistor of a preceding logic unit, as measured between the emitter and collector terminals of a transistor, is applied, essentially, across the base-emitter junction of a transistor in a succeeding logic unit so as to provide a supply of base current to the transistor of the succeeding logic unit without danger of saturating the transistor and without cutting off current flow to the transistor. Furthermore, the magnitude of resistance of the resistor of the preceding logic unit is sufficient to limit base current to the transistor of the succeeding logic unit so as to avoid saturation of the transistor in the succeeding logic unit. An output signal of the logic unit may be applied to an inverter circuit, and speed-up capacitors may be applied in emitter circuits of the inverter and the preceding logic unit for a sharpening of both leading and trailing edges of a logic signal.

10 Claims, 2 Drawing Sheets

COMPOSITE LOGIC GATE CIRCUIT WITH MEANS TO REDUCE VOLTAGE REQUIRED BY LOGIC TRANSISTORS FROM EXTERNAL SOURCE

BACKGROUND OF THE INVENTION

This invention relates to serially connected logic units wherein each logic unit, such as an AND gate or an OR gate, is composed of a resistor connected serially to a combination of plural transistors connected in parallel and, more particularly, to the construction of one of the logic units of PNP transistors and another of the logic units of NPN transistors wherein the voltage drop across a transistor of a first of the logic units establishes an operating voltage level for feeding current to the transistor of a following logic unit.

There are increasing demands for higher performance of computers, data processing equipment, and control systems which employ logic circuits, the. higher performance being in terms of greater speed of operation Due to the wide use of logic circuits in the foregoing equipments, an increase in the speed of response of the logic circuit provides a significant improvement in the performance of the equipment.

A typical form of construction of a logic circuit, such as an AND gate or an OR gate has an interconnection of a plurality of identical transistors in a parallel circuit combination, the combination then being connected serially with a resistor. The junction of the terminals of the parallel combination with a terminal of the resistor serves an output terminal of the gate, the opposite terminal of the resistor being connected to one terminal of a power supply and the opposite terminal of the parallel combination being connected to the other terminal of the power supply. With such a circuit arrangement, the transistors force current through the resistor in one direction for a fast response to the waveform of a pulse signal, a change of current in the opposite direction being accomplished relatively slowly in the manner of a capacitive discharge via the resistor with the capacitance being provided by stray capacitance of the circuit With such construction, the speed of response can be increased by reducing the resistance of the resistor.

However, a problem arises in that the reduction of the resistance increases the dissipation of power within the logic unit. However, computers, data processing equipment, and control systems are limited in the amount of power which can be dissipated therein. This limitation, in turn, limits the amount of reduction in resistance which is permissible before exceeding power dissipation limits. As a result, there is a need for still further modification of the circuitry of a logic unit to produce the advantage of increased speed.

SUMMARY OF THE INVENTION

The aforementioned problem is overcome and other advantages are provided by a logic circuit comprising a plurality of serially connected logic units wherein each unit is a gate comprising a resistor serially connected to a combination of a plurality of transistors connected together in parallel. In accordance with the invention, the transistors of the logic circuit are arranged to enable reduction of the requisite voltage to be provided by an external power source. By reduction of the voltage, there is a reduction in the power dissipated in the resistors. Thereby, the values of resistance can be reduced without exceeding the power dissipation budget The reduced voltage requirements are attained by constructing alternate logic units, in a series of logic units, of PNP and NPN transistors. Furthermore, the voltage drop across a transistor of a preceding logic unit, as measured between the emitter and collector terminals of a transistor, is applied, essentially, across the base-emitter junction of a transistor in a succeeding logic unit so as to provide a supply of base current to the transistor of the succeeding logic unit without danger of saturating the transistor and without cutting off current flow to the transistor. Furthermore, the magnitude of resistance of the resistor of the preceding logic unit is sufficient to limit base current to the transistor of the succeeding logic unit so as to avoid saturation of the transistor in the succeeding logic unit.

In the case of a logic unit constructed of PNP transistors, the resistor is connected to the emitter terminals of the various transistors of the logic unit. In the case of a logic unit constructed of NPN transistors, the resistor is connected to the collector terminals of the transistors of the logic unit. With respect to the logic unit employing the NPN transistors, it has been found advantageous to apply an output signal of the logic unit to an inverter circuit employing an NPN transistor in which case a relatively small resistor can be employed in the emitter circuit of the NPN transistors of the logic unit and of the inverter circuit, the emitter resistors being accompanied by speed-up capacitors connected in parallel with the respective emitter resistors. This allows for a sharpening of both leading and trailing edges of a logic signal for enabling an increased repetition frequency of the logic signals. This, in combination with the decreased response time associated with the reduction of the resistors of the respective logic units provides for a significant increase in the speed of response of the logic circuit.

BRIEF DESCRIPTION OF THE DRAWING

The aforementioned aspects and other features of the invention are explained in the following description, taken in connection with the accompanying drawing wherein.

DETAILED DESCRIPTION

Figure 1:
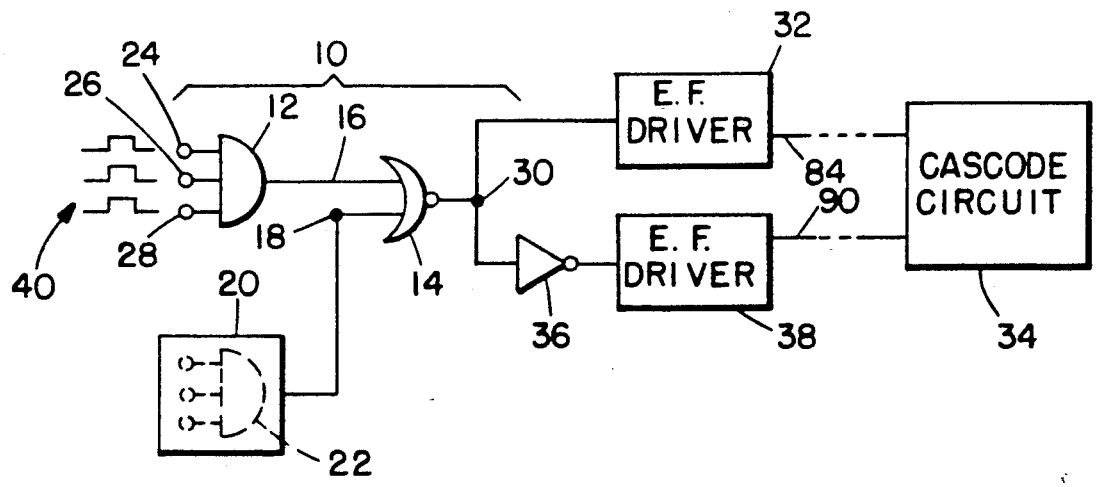
FIG. 1 is a simplified diagrammatic view of a logic circuit for employing the invention.

FIG. 1 shows a logic circuit 10 comprising a plurality of logic units connected serially and incorporating circuitry of the invention. Two such logic units are presented by way of example, it being understood that a longer series of logic units may be employed in accordance with the invention. The first of the two logic units is an AND gate 12 and the second of the two logic units is a NOR gate 14. An output terminal of the AND gate 10 is provided at a node 16. the node 16 being connected to a first input terminal of the NOR gate 14. A second input terminal 18 ot the NOR gate 14 serves as an input terminal of the circuit 10 and may receive an input signal from a signal source 20 which, by way of example, might be a further AND gate 22 indicated in phantom. The AND gate 12 is provided with three or more input terminals, three input terminals 24, 26 and 28 being shown, by way of example, these terminals serving also as input terminals of the circuit 10. A node 30 at an output terminal of the NOR gate 14 serves as an output terminal of the circuit 10 and, if desired, may be connected via an emitter-follower driver 32 to a load 34 such as a cascode circuit which operates in response to complementary input signals. One such input signal to the load 34 is the output of the NOR gate 14 coupled via the driver 32. Also included in the circuit 10 is an inverter 36 connected to the node 30 for converting the output signal of the NOR gate 14 to and OR signal which may be coupled, if desired, via an emitter-follower driver 38 to the load 34 to serve as the second of the complementary input signals to the load 34. Input logic signals to the input terminals 24, 26 and 28 of the AND gate 12 are indicated pictorially at 40, by way of example, as positive digital logic-1 pulses.

Figure 2:
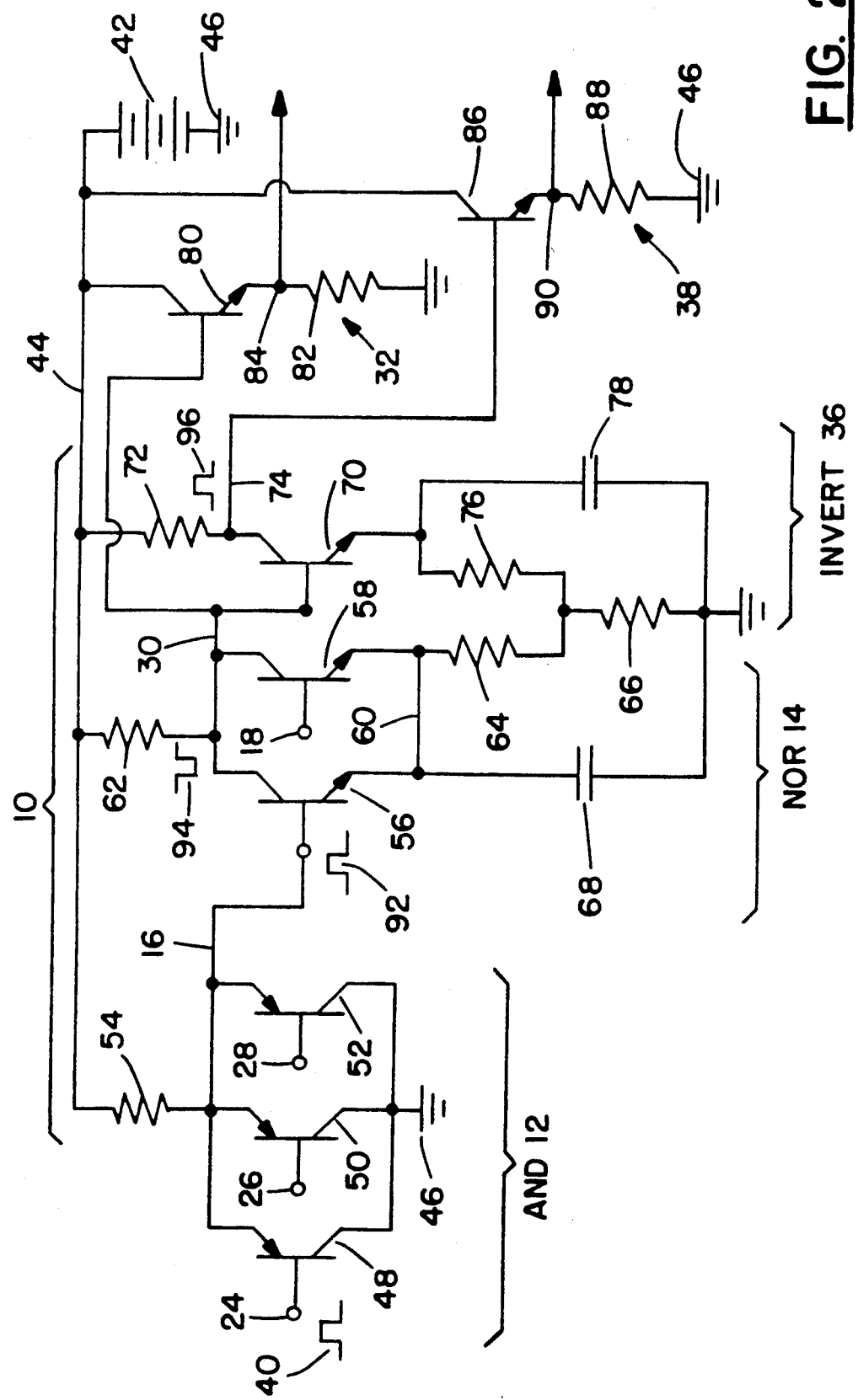
FIG. 2 is a schematic drawing of logic units within the circuit of FIG. 1.

FIG. 2 shows details in the construction of the logic circuit 10. Electric power for operation of the circuit 10 is provided by a power source, shown by way of example as a battery 42, having a first terminal and a second terminal, the first terminal 44 being positive relative to the second terminal which is connected to ground 46. In accordance with the invention, the circuit 10 includes both type-PNP transistors and type-NPN transistors, one type being used in tone of the logic units and the other type being used in a second of the logic units in alternating fashion along the series of logic units of the logic circuit 10. In the preferred embodiment of the invention the first logic unit, namely, the AND gate 12 comprises three or more identical PNP transistors, three of the transistors 48, 50 and 52 being shown by way of example. The three transistors 48, 50 and 52 have collector terminals connected together at ground 46 and emitter terminals connected together at the node 16. Base terminals of the transistors 48, 50 and 52, respectively, serve as the input terminals 24, 26 and 28. An emitter resistor 54 connects between the node 16 and the power terminal 44. The second logic unit, namely, the NOR gate 14 comprises two or more type-NPN transistors, two of the transistors 56 and 58 being shown. The two transistors 56 and 58 have their collector terminals connected together at the node 30 and their emitter terminals connected together at a node 60. A collector resistor 62 connects between the node 30 and the power terminal 44. If desired, the node 60 may be grounded directly at 46 for practice of the invention or, in accordance with a preferred embodiment of the invention, is connected to ground 46 preferably by two resistors 64 and 66 which are connected in series between the node 60 and ground. If desired, an optional speed-up capacitor 68 may also be connected between the node 60 and ground.

The inverter 36 comprises a type-NPN transistor 70 and a collector resistor 72 connected via a node 74 to the collector terminal of the transistor 70. Also included in the inverter 36 is an emitter resistor 76 connecting the emitter terminal of the transistor 70 to the junction of the resistors 64 and 66, and an optional speed-up capacitor 78 connected between the emitter terminal of the transistor 70 and ground. The driver 32 comprises an NPN transistor 80 and a resistor 82 connecting the emitter terminal of the transistor 80 to ground. A node 84 at the junction of the resistor 82 with the transistor 80 serves as an output terminal of the driver 32 for connection with the load 34. The driver 38 comprises an NPN transistor 86 and a resistor 88 connecting the emitter terminal of the transistor 86 to ground. A node 90 at the junction of the resistor 88 with the transistor 86 serves as an output terminal of the driver 38 for connection with the load 34. The output signal at node 90 is out of phase with the output signal at node 84.

In operation, a low voltage (logic-0) signal applied to any one of the input terminals 24, 26 or 28 of the AND gate 12 activates a corresponding one of the transistors 48, 50 or 52 to draw current through the resistor 54 producing a low voltage (logic-0) output at node 16. Only upon the occurrence of a high voltage (logic-1) signal at all three input terminals 24, 26 and 28, is there a reduction of current flow in the resistor 54 and the appearance of a high voltage (logic-1) signal at the node 16. In the NOR gate 14, a logic-1 signal from the node 16 applied to the base terminal of the transistor 56 activates the transistor 56 to draw current through the resistor 62 with the production of a low voltage (logic-0) signal at the node 30. Similarly, the presence of a logic-1 signal applied via the input terminal 18 to the base base of transistor 58 activates the transistor 58 to draw current through the resistor 62 with the production of a low voltage (logic-0) signal at the node 30. Also, the application of a logic-1 signal to the bases terminals of both the transistors 56 and 58 activates these transistors to draw current through the resistor 62 with production of a logic-0 signal at node 30. In the inverter 36, the application of a logic-0 signal via the node 30 to the base terminal of the transistor 70 operates the transistor 70 to decrease the flow of current in the resistor 72 to produce the relatively high voltage of the logic-1 signal at the node 74. Conversely, application of a logic-1 signal to the base terminal of the transistor 70 increases current in the resistor 72 with production of a logic-0 signal at node 74.

In a preferred embodiment of the invention, the power source voltage at terminal 44 is approximately 1.6 volts relative to ground. At the nodes 16 and 30, the difference in voltage levels between a logic-1 and a logic-0 signal is in the range of 0.50 to 0.53 volts. The voltage across the base-emitter junction of any one of the transistors 48, 50, 52, 56 and 58 is typically in the range of 0.9 to 0.8 volts. During a state of maximum conduction of the transistor 56, the voltage drop across the base collector junction is approximately 0.1 volts, this leaving a voltage drop between node 60 and ground of approximately 0.3 volts. In the inverter 36, the values of the resistances 76 and 72 are selected to provide for unity gain of the inverter 36. These values of voltage guard against saturation of the transistors of the gates 12 and 14 and of the inverter 36 so as to promote high speed performance of the logic circuit 10.

In accordance with a feature of the invention, the resistance of each of the emitter resistors 64 and 76 has a value equal to approximately 20–30 percent of the value of the respective collector resistors 62 and 72 so as to present no appreciable change of voltages of the logic states at the nodes 30 and 74. However, the values of resistance of the resistors 64 and 76 are sufficiently large to limit emitter current in the transistors 56, 58 and 70, so as to prevent saturation of these transistors. Operation of the transistors 56, 58 and 70 in a nonsaturated condition increases the speed of response of the NOR gate 14 and the inverter 36. As a further aid in the prevention of saturation of the transistor 56, it is noted that base current for the transistor 56 is supplied via the resistor 54 of the AND gate 12 and, accordingly, the resistance of the resistor 54 is large enough to limit the base current to the transistor 56 to a nonsaturating value. The values of resistance of the resistors 66, 64 and 76 are sufficient to provide feedback between the emitter voltage of the transistor 70 and the emitter voltage at the node 60. The feedback aids in providing a well-defined waveform to the signal at nodes 30 and 96. This positive feedback allows for a sharp D.C. characteristic curve which improves the circuit noise margin.

In accordance with a feature of the invention, the voltage drop across any one of the transistors of the AND gate 12, this being the voltage between the node 16 and ground, is applied between the base terminal of the transistor 56 and ground. This permits a reduction in the requisite voltage outputted by the power source, namely the battery 42, between the power terminal 44 and ground. By way of example, heretofore, a supply voltage of approximately 3.2 volts may have been employed in logic circuits of the prior art. This value of supply voltage is double that of the aforementioned value of 1.6 volts in the preferred embodiment of the circuit 10. The reduction of power supply voltage to 1.6 volts reduces the power consumption of the circuit 10 without reducing its response time.

The foregoing relationship of equality of voltage between successive ones of the logic units of the logic circuit 10, in accordance with the theory of the invention, enables the logic circuit 10 to be operated with significantly lower supply voltage than has been employed in logic circuits of the prior art. As a result of the reduced supply voltage, the value of resistance employed in the common emitter resistor 54 shared by the transistors of the AND gate 12 and the value of resistance employed in the common collector resistor 62 shared by the transistors of the NOR gate 14 can be reduced below those values employed in AND and NOR gates of the prior art without a dissipation of additional power as compared to the circuits of the prior art. The resultant reduced values of the common collector and the common emitter resistances reduces the transient time in the generation of an edge of a logic signal waveform upon a decrease in current of the foregoing transistor in any one of the logic units. Thus, the propagation time of signals through the logic circuit 10 is decreased with a significant increase in performance of the circuit 10. The foregoing improvement in speed of response applies also to the emitter follower circuits of the drivers 32 and 38 wherein the values of the resistors 82 and 88 may be reduced from that of the prior art for driving large capacitance of electrical wiring between the circuit 10 and other circuits which may be constructed on a common circuit semiconductor chip with the circuit 10.

As a further feature for enhancement of the performance of the circuit 10 the capacitors 68 and 78 serve to reduce further the transient behavior of edges of the logic signal waveforms. With respect to the waveform of the signal outputted by the node 16, indicated pictorially at 92, in response to concurrent logic-1 signals at the input terminals 24, 26 and 28, the leading edge of the signal 92 raises the voltage of the base terminal of the transistor 56. The initial current flow in the transistor 56 is absorbed by the capacitor 68 so as to remove momentarily the negative feedback of the resistor 64. The leading edge of the waveform of the resulting signal at node 30, indicated pictorially at 94, shows a rapid response of the transistor 56 and a rapid decrease in voltage. The trailing edge of the signal 94 provides an increasing voltage to the base terminal of the transistor 70 of the inverter 36 for increasing current flow in the transistor 70. The capacitor 78 functions in the manner just described for the capacitor 68, and provides for a rapid response of the transistor by momentarily bypassing the negative feedback of the resistor 76 to produce a rapid decrease in the voltage at node 74 at the trailing edge of the signal waveform, depicted at 96. Thus, the two capacitors 68 and 78 have cooperated to improve response time and to decrease transient times at the leading and the trailing edges of the logic signal at node 30 as well as the complementary logic signal at node 74.

Figure 3:
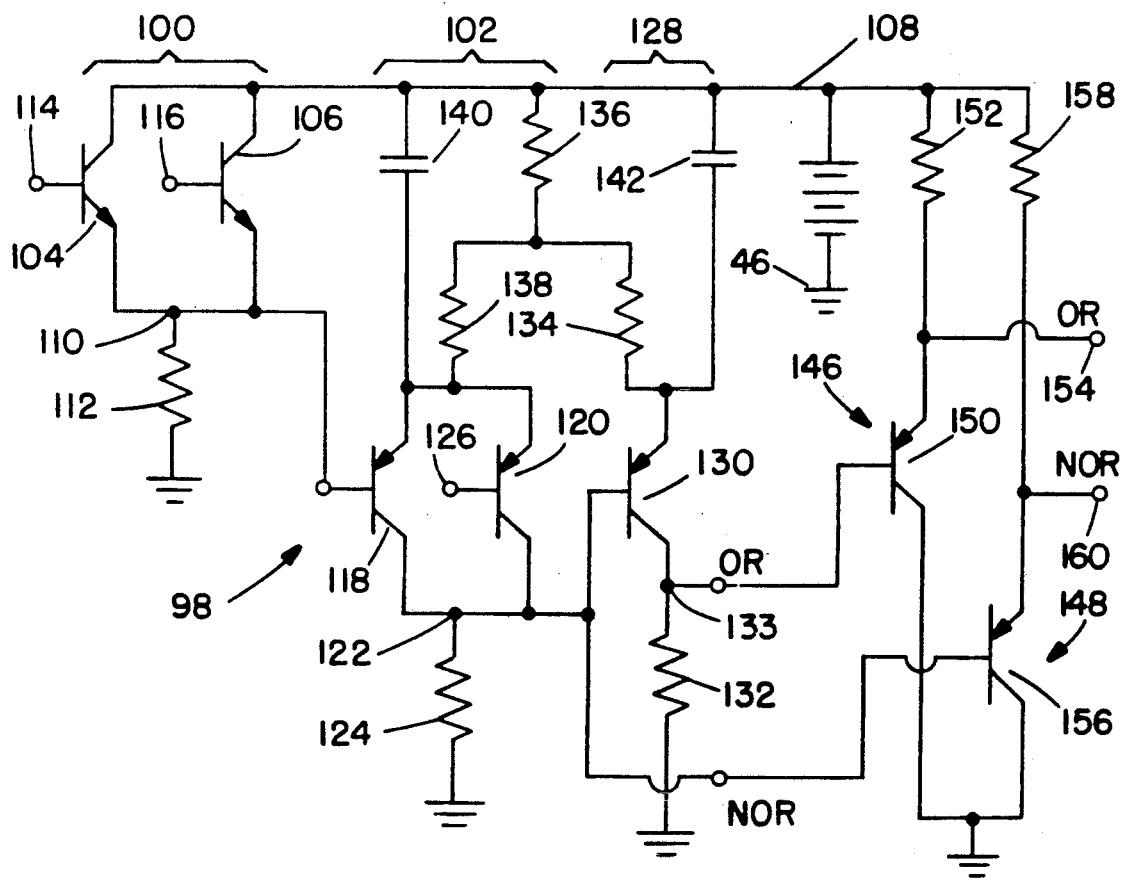
FIG. 3 is a simplified schematic drawing of an alternative embodiment of the circuit of FIG. 2.

FIG. 3 presents a simplified schematic representation of a logic circuit 98 comprising a first logic unit and a second logic unit serial connected to each other wherein the first logic unit is an AND gate 100 and the second logic unit is a NOR gate 102. The embodiment of the logic circuit 98 differs from the embodiment of the logic circuit 10 (FIG. 2) in that, in the logic circuit 10, the first logic unit employs PNP transistors followed by the second logic unit employing NPN transistors while, in the logic circuit 98, the first logic unit employs NPN transistors followed by the second logic unit employing PNP transistors. In the logic circuit 98 of FIG. 3, the AND gate 100 comprises two transistors 104 and 106 having their collector terminals connected together at a positive power supply terminal 108 and their emitter terminals connected together via a node 110 to an emitter resistor 112. The emitter resistor 112 connects between the node 110 and ground. Base terminals 114 and 116, respectively, of the transistors 104 and 106 serve as input terminals of the AND gate 100. The node 110 serves as an output terminal of the AND gate 100. The NOR gate 102 comprises two transistors 118 and 120 having their emitter terminals connected together at the power terminal 108 and the collector terminals connected together via a node 122 to a collector resistor 124. The collector resistor 124 connects between the node 122 and ground. The node 122 serves as an output terminal of the NOR gate 102. The base terminal of the transistor 118 serves as one input terminal of the NOR gate 102 and connects to the node 110 of the AND gate 100. The base terminal 26 of the transistor 120 serves as a second input terminal of the NOR gate 102.

The circuit 98 may be provided with an inverter 128 comprising a PNP transistor 130 and a collector resistor 132 connected between a collector of the transistor 130 and ground. An output signal of the NOR gate 102, at the node 122, is applied to a base terminal of the inverter transistor 130 to provide an output OR signal, at the node 133, of the circuit 98 in addition to the output NOR signal. Also, the circuit 98 may be provided with an emitter feedback circuit comprising three resistors 134, 136 and 138. The resistors 134 and 136 are connected serially between the emitter terminal of the transistor 130 and the positive power terminal 108. The resistor 138 connects between the junction of the resistors 134 and 136 with the junction of the emitter terminals of the transistors 118 and 120. A speed-up capacitor 140 may be connected from the junction of the emitter terminals of the transistors 118 and 120 to ground. A speed-up capacitor 142 may also be connected from the emitter terminal of the transistor 128 to ground.

The circuit of FIG. 3 includes also two output drivers 146 and 148. The driver 146 comprises a PNP transistor 150 and a resistor 152 connecting the emitter terminal of transistor 150 to positive supply terminal 108. A node 154 at the junction of resistor 152 with the emitter of transistor 150 serves as an output terminal of the driver 146 for connection with a load. The driver 148 comprises a PNP transistor 156 and resistor 158 connecting the emitter terminal of transistor 156 to positive supply terminal 108. A node 160 at the junction of resistor 158 with the emitter of transistor 156 serves as an output terminal of the driver 148 for connection with a load. The collector terminals of both transistors 150 and 156 are connected to ground.

In the operation of the logic circuit 98, a logic-1 signal is represented by a low voltage, or negatively directed pulse, and a logic-0 signal is represented by a high voltage, or positively directed pulse. Pictorial representations of logic pulse signals are presented adjacent various terminals of the circuit 98. At the AND gate 100, the presence of a high (positive) voltage at either one or both of the base terminals 114 and 116 produces current flow in the resistor 112 resulting in a relatively high voltage (logic-0) at the node 110. Only upon the occurrence of logic-1 signals at both of the base terminals 114 and 116, does the current in the resistor 112 decrease to produce a low voltage (logic-1) at the node 110. At the NOR gate 102, upon the presence of a logic-1 signal at either one or both of the base terminals of the transistors 118 and 120, there results a flow of current in the resistor 124 raising the voltage at the node 122 to a relatively high value (logic-0). The inverter 128 and the speed-up capacitors 140 and 142 function in a manner similar to that of the inverter 36 and the capacitors 68 and 78 of FIG. 3. The feedback circuit of the three resistors 134, 136 and 138 functions in a manner similar to the feedback circuit of the resistors 76, 66 and 64 of FIG. 3.

In accordance with the invention, the voltage drop across the parallel combination of the transistors 104 and 106, as measured between their respective collector and emitter terminals, appears across the base-emitter terminal of the transistor 118 of the NOR gate 102. As has been explained with reference to the logic circuit 10, this equality of voltage drop of the transistors of the preceding logic unit, or stage of the logic circuit, with the voltage drop across the input base-emitter junction of the following stage permits reduction of the required power-supply voltage. The reduced supply voltage permits the reduction of power consumption in the circuit which, in turn, permits a reduction in the resistances of the collector and the emitter resistances for increased speed of performance of the logic circuit. Thus, the arrangement in FIG. 3 of NPN transistors of one stage followed by PNP transistors in a following stage is effective to carry out the principles of the invention as in the case of the circuit of FIG. 2 wherein a stage of PNP transistors is followed by a stage of NPN transistors.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A logic circuit comprising:
   a first logic unit and a second logic unit which are operative upon energization by a power source, said power source having a first power-source terminal and a second power-source terminal providing a voltage where in the first terminal is positive relative to the second terminal, said first logic unit outputting a first output signal for driving said second logic unit; and wherein said first logic unit comprises a plurality of PNP transistors and an emitter resistor shared by said PNP transistors, there being a junction of emitter terminals of said PNP transistors with said emitter resistor at a first node providing said first output signal, a terminal of said emitter resistor opposite said first node being connected to said first power-source terminal, and collector terminals of said PNP transistors being connected to said second power-source terminal;

said second logic unit comprises a plurality of NPN transistors and a collector resistor shared by said NPN transistors, there being a junction of collector terminals of said NPN transistors with said collector resistor at a second node providing a second output signal, a terminal of said collector resistor opposite said second node being connected to said first power-source terminal, and emitter terminals of said NPN transistors being connected to said second power-source terminal; and said first node connects with a base terminal of one of said NPN transistors, a voltage drop between said first node and said second power-source terminal being greater than a voltage drop between a base terminal of said one NPN transistor and said second power-source terminal to provide continuous base current to said one NPN transistor and permitting reduction of the voltage of said power source.

2. A logic circuit according to claim 1 further comprising antisaturation means coupled to said one NPN transistor for restricting operation of said one NPN transistor to a nonsaturating mode of operation.

3. A logic circuit according to claim 2 wherein said antisaturation means comprises a resistor connected between an emitter terminal of said one NPN transistor and said second power source terminal.

4. A logic circuit according to claim 3 wherein said emitter resistor of said first logic unit provides base current to said one NPN transistor of said second logic unit, said emitter resistor of said first logic unit serving as a part of said antisaturation means 5. A logic circuit according to claim 4 further comprising an inverter coupled to said second node for inverting said second output signal, said inverter comprising a transistor and a collector resistor serially connected between said second power source terminal and said first power source terminal, said inverter including a resistor connected between an emitter terminal of said inverter transistor and said second power source terminal, and wherein said logic circuit includes capacitors connected between said second power source terminal and the emitter terminal of each of the transistors of said second logic unit and of said inverter for reducing transient response times of edges of logic pulse signals propagating though said logic circuit.

6. A logic circuit comprising:
   a first logic unit and a second logic unit which are operative upon energization by a power source, said power source having a first power-source terminal and a second power-source terminal providing a voltage therebetween, said first logic unit having a first node connected to said second logic unit for driving said second logic unit; and wherein said logic circuit comprises two types of transistors including type NPN and type PNP, each of said type NPN and said type PNP transistors comprising a base terminal and two end terminals, the two end terminals including a collector terminal and an emitter terminal;

said first logic unit comprises a plurality of transistors of a first of said types and a first resistor, said first resistor being connected between said first power-source terminal and said first node, said first node connecting to a first end terminal at each of said first-type transistors, second end terminals of said first-type transistors being connected to said second power-source terminal, base terminals of said first-type transistors serving as input terminals of said logic circuit;

said second logic comprises a plurality of transistors of a second of said types and a second resistor, said second resistor being connected between said first power-source terminal and a second node, said second node connecting to the second end terminal at each of said second-type transistors, first end terminals of said second-type transistors being connected to said second power-source terminal, said second node providing an output signal of said logic circuit, a base terminal of one of said second-type transistors being connected to said first node, a base terminal of a second of said second-type transistors serving as an input terminal of said logic circuit separate from the base terminal of said one of said second type transistors; and a voltage drop between said first node and said second power-source terminal is greater than a voltage drop between a base terminal of said one second-type transistor and said second power-source terminal to provide continuous base current to said one second-type transistor and permitting reduction of the voltage of said power source.

7. A logic circuit comprising:

a first logic unit and a second logic unit which are operative upon energization by a power source, said power source having a first power-source terminal and a second power-source terminal providing a voltage therebetween, said first logic unit having a first node connected to said second logic unit for driving said second logic unit; and wherein said logic circuit comprises two types of transistors including type NPN and type PNP, each of said type NPN and said type PNP transistors comprising a base terminal and two end terminals, the two end terminals including a collector terminal and an emitter terminal;

said first logic unit comprises a plurality of transistors of a first of said types and a first resistor, said first resistor being connected between said first power-source terminal and said first node, said first node connecting to a first end terminal at each of said first-type transistors, second end terminals of said first-type transistors being connected to said second power-source terminal, base terminals of said first-type transistors serving as input terminals of said logic circuit;

said second logic unit comprises a plurality of transistors of a second of said types and a second resistor, said second resistor being connected between said first power-source terminal and a second node, said second node connecting to the second end terminal at each of said second-type transistors, first end terminals of said second-type transistors being connected to said second power-source terminal, said second node providing an output signal of said logic circuit, a base terminal of one of said second-type transistors being connected to said first node, a base terminal of a second of said second-type transistors serving as an input terminal of said logic circuit;

a voltage drop between said first node and said second power-source terminal is greater than a voltage drop between a base terminal of said one second-type transistor and said second power-source terminal to provide continuous base current to said one second-type transistor and permitting reduction of the voltage of said power source; and said first type transistor is a PNP transistor, said second type transistor is a NPN transistor said first resistor is an emitter resistor, said second resistor is a collector resistor, and said first power-source terminal is positive relative to said second power-source terminal.

8. A logic circuit according to claim 6 wherein said first type transistor is an NPN transistor, said second type transistor is a PNP transistor said first resistor is an emitter resistor, said second resistor is a collector resistor, and said first power-source terminal is positive relative to said second power-source terminal.

9. A logic circuit comprising:

a first logic unit and a second logic unit which are operative upon energization by a power source, said power source having a first power-source terminal and a second power-source terminal providing a voltage therebetween, said first logic unit having a first node connected to said second logic unit for driving said second logic unit; and wherein said logic circuit comprises two types of transistors including type NPN and type PNP, each of said type NPN and said type PNP transistors comprising a base terminal and two end terminals, the two end terminals including a collector terminal and an emitter terminal;

said first logic unit comprises a plurality of transistors of a first of said types and a first resistor, said first resistor being connected between said first power-source terminal and said first node, said first node connecting to a first end terminal at each of said first-type transistors, second end terminals of said first-type transistors being connected to said second power-source terminal, base terminals of said first-type transistors serving as input terminals of said logic circuit;

said second logic unit comprises a plurality of transistors of a second of said types and a second resistor, said second resistor being connected between said first power-source terminal and a second node, said second node connecting to the second end terminal at each of said second-type transistors, first end terminals of said second-type transistors being connected to said second power-source terminal, said second node providing an output signal of said logic circuit, a base terminal of one of said second-type transistors being connected to said first node, a base terminal of a second of said second-type transistors serving as an input terminal of said logic circuit;

a voltage drop between said first node and said second power-source terminal is greater than a voltage drop between a base terminal of said one second-type transistor and said second power-source terminal to provide continuous base current to said one second-type transistor and permitting reduction of the voltage of said power source; and; said first logic unit is an AND gate and said second logic unit is a NOR gate.

10. A logic circuit according to claim 9 further comprising an inverter coupled to said second node for inverting said output signal of said logic circuit, said inverter comprising a transistor and a collector resistor serially connected between said second power source terminal and said first power source terminal, said inverter including a resistor connected between an emitter terminal of said inverter transistor and said second power source terminal, and wherein said logic circuit includes capacitors connected between said second power source terminal and the emitter terminal of each of the transistors of said second logic unit and of said inverter for reducing transient response times of edges of logic pulse signals propagating though said logic circuit.

* * * * *